United States Patent
Gong et al.

(10) Patent No.: US 11,005,474 B2
(45) Date of Patent: May 11, 2021

(54) SYSTEMS WITH POWER TRANSISTORS, TRANSISTORS COUPLED TO THE GATES OF THE POWER TRANSISTORS, AND CAPACITIVE DIVIDERS COUPLED TO THE POWER TRANSISTORS

(71) Applicant: TEXAS INSTRUMENTS INCORPORATED, Dallas, TX (US)

(72) Inventors: Xun Gong, Freising (DE); Ingolf Frank, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/929,266

(22) Filed: Jul. 15, 2020

(65) Prior Publication Data
US 2020/0343887 A1    Oct. 29, 2020

Related U.S. Application Data

(63) Continuation of application No. 16/148,211, filed on Oct. 1, 2018, now Pat. No. 10,756,726.

(51) Int. Cl.
*H03K 17/28* (2006.01)
*H03K 17/567* (2006.01)
*H03K 17/16* (2006.01)

(52) U.S. Cl.
CPC ............ *H03K 17/28* (2013.01); *H03K 17/16* (2013.01); *H03K 17/567* (2013.01); *H03K 2217/0081* (2013.01)

(58) Field of Classification Search
CPC ............... H03K 17/166; H03K 17/168; H03K 17/082–0828; H03K 17/28; H03K 17/16; H03K 17/284
See application file for complete search history.

(56) References Cited

U.S. PATENT DOCUMENTS 4,394,590 A    7/1983   Honda
4,751,408 A    6/1988   Rambert
(Continued)

*Primary Examiner* — Thomas J. Hiltunen
(74) *Attorney, Agent, or Firm* — Mark Allen Valetti; Charles A. Brill; Frank D. Cimino

(57) ABSTRACT

A system to regulate power from a first power supply to a load coupled to the first power supply, wherein a power transistor is coupled between the load and ground. The system includes: a transistor having a control terminal, a first current terminal adapted to be coupled to an external second power supply and a second current terminal adapted to be coupled to a control terminal of the power transistor; a first resistor having a first node coupled to the control terminal of the transistor and a second node adapted to be coupled to a first terminal of a second external capacitor, the first node of the first resistor is adapted to be coupled to a first terminal of a first external capacitor; a second resistor having a first node coupled to the control terminal of the transistor and a second node adapted to be coupled to ground, the first node of the second resistor is adapted to be coupled to a first terminal of an first external resistor; and wherein a second terminal of the first external capacitor is coupled to a node between the load and a first current terminal of the power transistor and a second terminal of the second external capacitor is coupled to form a capacitive divider with the first external capacitor and the first resistor, and a second node of the first external resistor is coupled to the node between the load and the first current terminal of the power transistor to form a resistive divider with the second resistor.

15 Claims, 3 Drawing Sheets

(56) References Cited

U.S. PATENT DOCUMENTS

| | | | |
|---|---|---|---|
| 5,742,087 A * | 4/1998 | Lidow | H01L 29/0615 257/342 |
| 6,320,362 B1 | 11/2001 | Baek et al. | |
| 6,697,241 B1 | 2/2004 | Smith | |
| 7,365,952 B2 * | 4/2008 | Sato | H02J 7/0031 361/90 |
| 7,514,967 B2 * | 4/2009 | Higashi | H03K 17/0828 327/108 |
| 8,228,125 B2 | 7/2012 | Heijden et al. | |
| 8,461,903 B1 | 6/2013 | Granger-Jones | |
| 8,653,628 B1 | 2/2014 | Song et al. | |
| 8,847,636 B2 * | 9/2014 | Kerr | H03K 19/00315 327/112 |
| 9,071,245 B2 * | 6/2015 | Rozman | H03K 17/166 |
| 9,203,393 B2 | 12/2015 | Takasu et al. | |
| 10,075,157 B1 | 9/2018 | Hartog et al. | |
| 10,110,142 B2 | 10/2018 | Outram | |
| 10,122,298 B2 * | 11/2018 | Kaneda | H02M 7/5395 |
| 10,367,496 B2 * | 7/2019 | Ying | H03K 17/168 |
| 10,461,732 B1 * | 10/2019 | Norling | H03K 17/168 |
| 10,756,726 B2 * | 8/2020 | Gong | H03K 17/567 |
| 2001/0015670 A1 * | 8/2001 | Sakai | H02M 1/08 327/434 |
| 2005/0206438 A1 * | 9/2005 | Higashi | H03K 17/166 327/427 |
| 2012/0200338 A1 | 8/2012 | Olson | |
| 2013/0057332 A1 | 3/2013 | Aggeler et al. | |
| 2013/0249619 A1 | 9/2013 | Granger-Jones | |
| 2014/0292287 A1 | 10/2014 | Rutter et al. | |
| 2020/0058603 A1 | 2/2020 | Afin et al. | |

\* cited by examiner

SYSTEMS WITH POWER TRANSISTORS, TRANSISTORS COUPLED TO THE GATES OF THE POWER TRANSISTORS, AND CAPACITIVE DIVIDERS COUPLED TO THE POWER TRANSISTORS

CROSS-REFERENCE TO RELATED APPLICATIONS

This application claims priority to U.S. patent application Ser. No. 16/148,211, filed Oct. 1, 2018. The entire disclosure of Ser. No. 16/148,211 is hereby fully incorporated herein by reference.

BACKGROUND

Many kinds of power circuits include a power transistor to control power delivered from a power supply to a load, where the power supply, load, and power transistor are serially coupled. The power circuit includes a gate driver to control the gate voltage of the power transistor.

SUMMARY

In accordance with at least one example of the disclosure, a system comprises: a power transistor comprising a gate, a first terminal, and a second terminal; a transistor comprising a gate, a first terminal, and a second terminal coupled to the gate of the power transistor; a capacitive divider coupled to the first terminal of the power transistor and the gate of the transistor; and a resistive divider coupled to the first terminal of the power transistor and the gate of the transistor.

In accordance with at least one example of the disclosure, a system comprises: a first power supply; a ground; a load coupled to the first power supply; a power transistor comprising a gate, a first terminal coupled to the load, and a second terminal coupled to the ground, the first power supply to provide power to the load when the power transistor is on; a transistor comprising a gate, a first terminal, and a second terminal coupled to the gate of the power transistor to inject current to the gate of the power transistor when the transistor is on; a capacitive divider coupled to the first terminal of the power transistor and the ground, the capacitive divider coupled to the gate of the transistor to turn on the transistor in response to a time-varying voltage increase at the first terminal of the power transistor; and a resistive divider coupled to the first terminal of the power transistor, the resistive divider coupled to the gate of the transistor to bias the gate of the transistor.

In accordance with at least one example of the disclosure, a method comprises: passing, with a capacitive divider, a group of frequency components of a voltage transient to a gate of a transistor; and injecting current to a gate of a power transistor by turning on the transistor in response to the voltage transient.

BRIEF DESCRIPTION OF THE DRAWINGS

For a detailed description of various examples, reference will now be made to the accompanying drawings in which.

DETAILED DESCRIPTION

Under some conditions, such as an over-current condition, the gate driver of a power circuit will switch off the power transistor to reduce load current. For example, in the case of a short circuit in the load, a typical power circuit switches off the power transistor completely in a very short period of time. In such cases, a voltage overshoot can develop due to a sudden current change through a parasitic inductance. Examples described herein include circuitry for injecting current into the gate of the power transistor so that the power transistor maintains a current flow through the parasitic inductance long enough to prevent the build-up of voltage overshoots.

Figure 1:
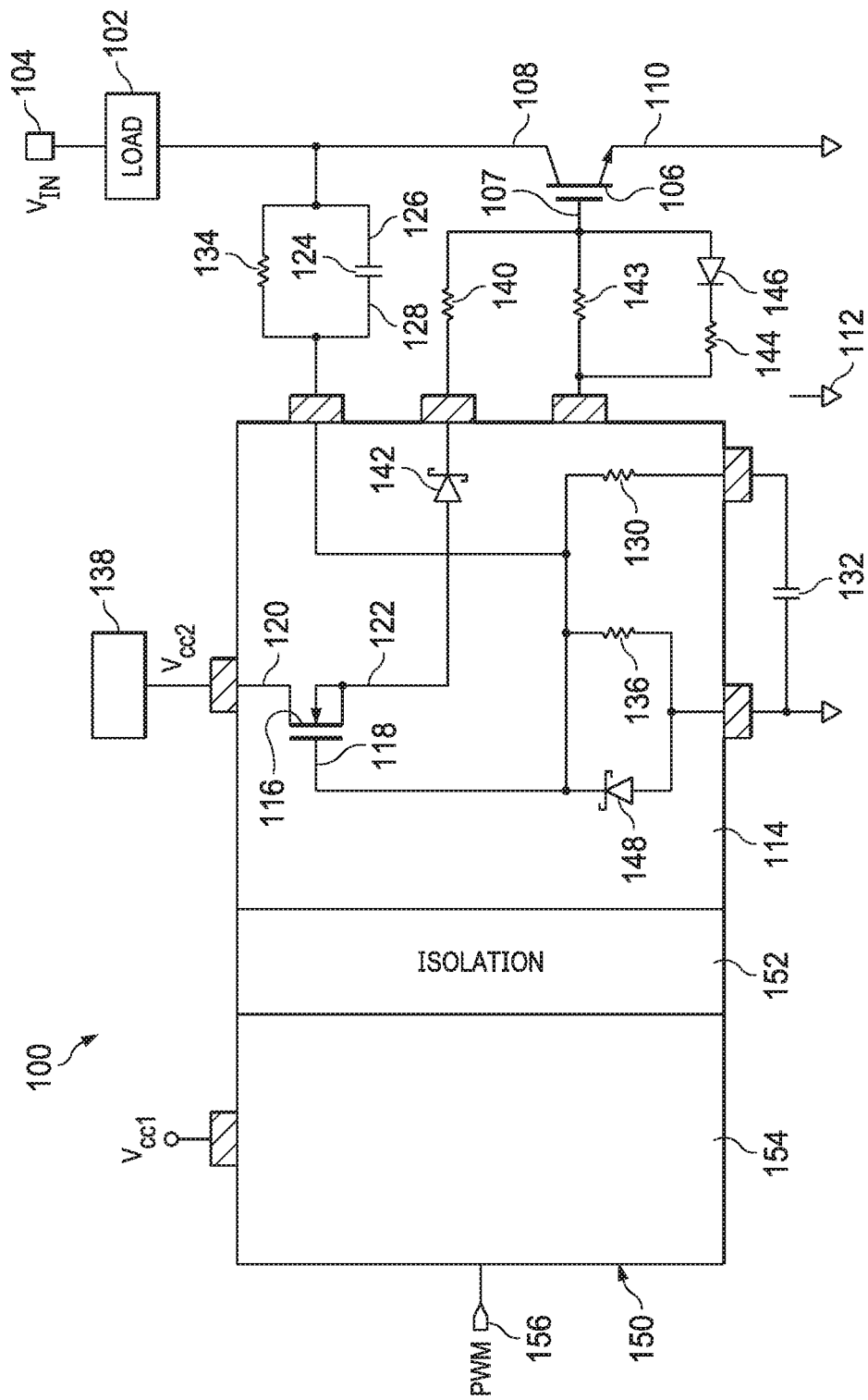
FIG. 1 shows a system in accordance with various examples.

FIG. 1 depicts a system 100, with applications providing regulated power from a first power supply 104 to a load 102. A power transistor 106 is coupled in series with the load 102 to regulate current through the load 102. The power transistor 106 comprises a gate 107, a first terminal 108, and a second terminal 110. The first terminal 108 is coupled to the load 102 and the second terminal 110 is coupled to a ground 112. The first power supply 104 provides a first supply voltage, denoted in FIG. 1 as $V_{IN}$, across the load 102 and the power transistor 106, so as to provide power to the load 102 when the power transistor 106 is on. The system 100 regulates power supplied to the load 102 by controlling the voltage drop developed across the power transistor 106. The power transistor 106 is shown as an insulated gate bipolar transistor (IGBT). Examples can also utilize a metal-oxide-semiconductor field-effect-transistor (MOSFET) for the power transistor 106, as well as other types of transistors.

The system 100 includes a gate driver 114 to control the power transistor 106. The gate driver 114 includes circuitry with various functionalities to control the power transistor 106 to achieve various goals, such as providing a regulated voltage to the load 102. The gate driver 114 includes circuitry to adjust the voltage of the gate 107 of the power transistor 106 based upon comparing a feedback voltage to a reference voltage. The gate driver 114 can switch the power transistor 106 on to conduct current through the load 102. If the load 102 experiences a short, too much current could be sourced through the load 102. In such instances, the gate driver 114 can switch the power transistor 106 off.

However, if the power transistor 106 is switched off too quickly, a voltage overshoot can develop at the first terminal 108 due to parasitic inductance. Examples described herein are concerned with circuitry within the gate driver 114 for controlling the power transistor 106 so as to prevent voltage overshoots.

The system 100 includes a transistor 116 comprising a gate 118, a first terminal 120, and a second terminal 122 coupled to the gate 107 of the power transistor 106. FIG. 1 shows the transistor 116 as an n-Metal-Oxide-Semiconductor Field-Effect-Transistor (nMOSFET), but transistors, in some examples, are employed. As will be described, circuit components are coupled to the transistor 116 to cause it to inject current into the gate of the power transistor 106 when the beginning of a voltage overshoot is detected, thereby preventing the power transistor 106 from being shut off too quickly.

The system 100 includes a capacitive divider comprising a first capacitor 124 having a first terminal 126 coupled to the first terminal 108 of the power transistor 106 and a second terminal 128 coupled to the gate 118 of the transistor 116, a first resistor 130, and a second capacitor 132. The first capacitor 124, the first resistor 130, and the second capacitor 132 are serially coupled between the first terminal 108 of the power transistor 106 and the ground 112. In the example of FIG. 1, the first resistor 130 is shown as being directly connected to the gate 118, positioned between the first capacitor 124 and the second capacitor 132. In some examples, the relative positions of the first resistor 130 and the second capacitor 132, as shown in FIG. 1, can be interchanged, so that the second capacitor 132 is directly connected to the gate 118.

The system 100 includes a resistive divider comprising a second resistor 134 coupled to the first terminal 108 of the power transistor 106, and a third resistor 136 coupled to the second resistor 134 and the gate 118 of the transistor 116. When the system 100 is in operation, the resistor divider (comprising the second resistor 134 and the third resistor 136) provides a bias voltage at the gate 118 of the transistor 116. The bias voltage provided by the resistive divider is just below the threshold voltage of the transistor 116.

The capacitive divider (comprising the first capacitor 124, the first resistor 130, and the second capacitor 132) increases the gate voltage of the gate 118 in response to the beginning of a voltage overshoot at the load 102 and the first terminal 108 of the power transistor 106. The increase in gate voltage of the transistor 116 causes the transistor 116 to turn on. The first terminal 120 of the transistor 116 is coupled to a second power supply 138. When the transistor 116 turns on, current provided by the second power supply 138 is injected into the gate 107 of the power transistor 106, preventing the gate driver 114 from switching off the power transistor 106 completely, and thereby reducing the voltage overshoot.

The capacitive divider (comprising the first capacitor 124 and the second capacitor 132) is coupled to the gate 118 of the transistor 116 to turn on the transistor 116 in response to a time-varying voltage increase at the first terminal 108 of the power transistor 106. Accordingly, the capacitive divider acts as a high-pass filter in the sense that the high-frequency signal components of the voltage overshoot are passed to the gate 118. The first resistor 130 adds additional voltage to the gate 118. In some examples, the first resistor 130 is absent. The combination of the first capacitor 124 and the third resistor 136 acts as a mid-pass filter in the sense that mid-frequency signal components of the voltage overshoot are passed to the gate 118. Propagating both high and mid frequency components of the beginning of a voltage overshoot to the gate 118 prevents the power transistor 106 from being turned off too quickly.

The circuitry can be described as a PID (proportional-integral-derivative) control loop: the proportional part comprises the resistor 134 and the resistor 136; the derivative part comprises the capacitor 124, the resistor 136, and the resistor 130; and the integral part comprises the resistor 134 and the capacitor 132. The ratio of the capacitor 124 to the capacitor 132 defines the voltage at which the PID controller starts operating. This sets the level of overshoot voltage to be regulated. Below this level the circuit can work undisturbed, i.e., at its highest speed, and at this level the PID controller regulates and stabilizes the voltage. The PID controller regulates the voltage overshoot to a value below the absolute maximum tolerated voltage level of the transistor 106.

The system 100 can further include a fourth resistor 140 and a first diode 142. The fourth resistor 140 and the first diode 142 are serially coupled, and couple the second terminal 122 of the transistor 116 to the gate 107 of the power transistor 106. The fourth resistor 140 can be chosen to limit current injected into the gate 107. Some examples can also include a second diode 148 for voltage protection.

FIG. 1 shows a fifth resistor 143 in parallel with a sixth resistor 144 and a third diode 146, where this combination of circuit components couples the gate 107 to the gate driver 114. FIG. 1 shows the ground 112 coupled to the second terminal 110 of the power transistor 106, the capacitive divider (comprising the first capacitor 124, the second capacitor 132, and the first resistor 130), and the resistive divider (comprising the second resistor 134 and the third resistor 136). The ground 112 can be a ground interconnect or ground plane on a circuit board.

Some or all of the circuit components shown in FIG. 1 can be integrated in one or more packaged integrated circuits, such as a packaged integrated circuit 150. In the example of FIG. 1, the circuit components integrated in the gate driver 114 as part of the packaged integrated circuit 150 are: the transistor 116, the first diode 142, the first resistor 130, the third resistor 136, and the second diode 148. Furthermore, FIG. 1 shows the following components external to the packaged integrated circuit 150: the first power supply 104, the first capacitor 124, the second capacitor 132, the second resistor 134, the load 102, the power transistor 106, the second power supply 138, the fourth resistor 140, the fifth resistor 143, the sixth resistor 144, and the third diode 146. Some examples include a different selection of components external to the packaged integrated circuit 150, and a different selection of components integrated in the packaged integrated circuit 150.

The packaged integrated circuit 150 includes an isolation region 152 to isolate the gate driver 114 from other circuit components in the packaged integrated circuit 150, where these other circuit components in the example of FIG. 1 belong to a different voltage domain. For example, the example of FIG. 1 shows the second power supply 138 providing a second supply voltage $V_{CC2}$ to the gate driver 114, whereas a voltage domain 154 of the packaged integrated circuit 150 is at a different supply voltage, denoted as $V_{CC1}$. FIG. 1 also shows an input port 156 for receiving a pulse width modulation (PWM) signal for providing various control functionalities.

In some examples, the second power supply 138 is coupled to the first terminal 120 of the transistor 116 to provide a second supply voltage less than the first supply voltage provided by the first power supply 104.

Figure 2:
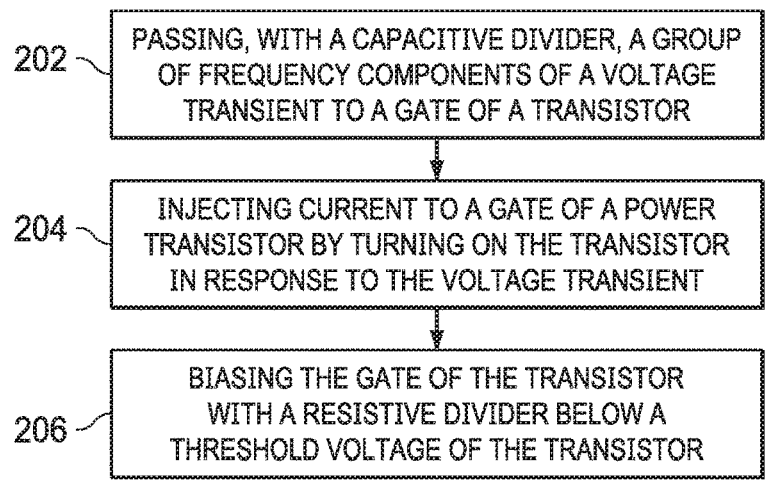
FIG. 2 shows a method in accordance with various examples.

FIG. 2 shows a method 200 according to an example circuit. The method 200 comprises, in step 202, passing, with a capacitive divider, a group of frequency components of a voltage transient to a gate of a transistor; and, in step 204, injecting current to a gate of a power transistor by turning on the transistor in response to the voltage transient. The term voltage transient is used here to indicate the beginning of a voltage overshoot, although the voltage overshoot is prevented from reaching its peak because injection current into the gate of the power transistor keeps the power transistor turned on. The group of frequency components are the high-frequency components of the voltage transient, determined by the transfer function of the capacitive divider. In some embodiments, the capacitive divider comprises a resistor serially connected with two capacitors, for example the capacitive divider of FIG. 1 comprising capacitive comprising the first capacitor 124, the second capacitor 132, and the first resistor 130. The method 200 further comprises, in step 206, biasing the gate of the transistor with a resistive divider below a threshold voltage of the transistor. For example, the resistive divider comprising the second resistor 134 and the third resistor 136 is designed to bias the gate 118 of the transistor 116 to a value just below its threshold so that the high-frequency components passed by the capacitive divider due to a voltage transient at the first terminal 108 of the power transistor 106 is sufficient to turn on the transistor 116.

Figure 3:
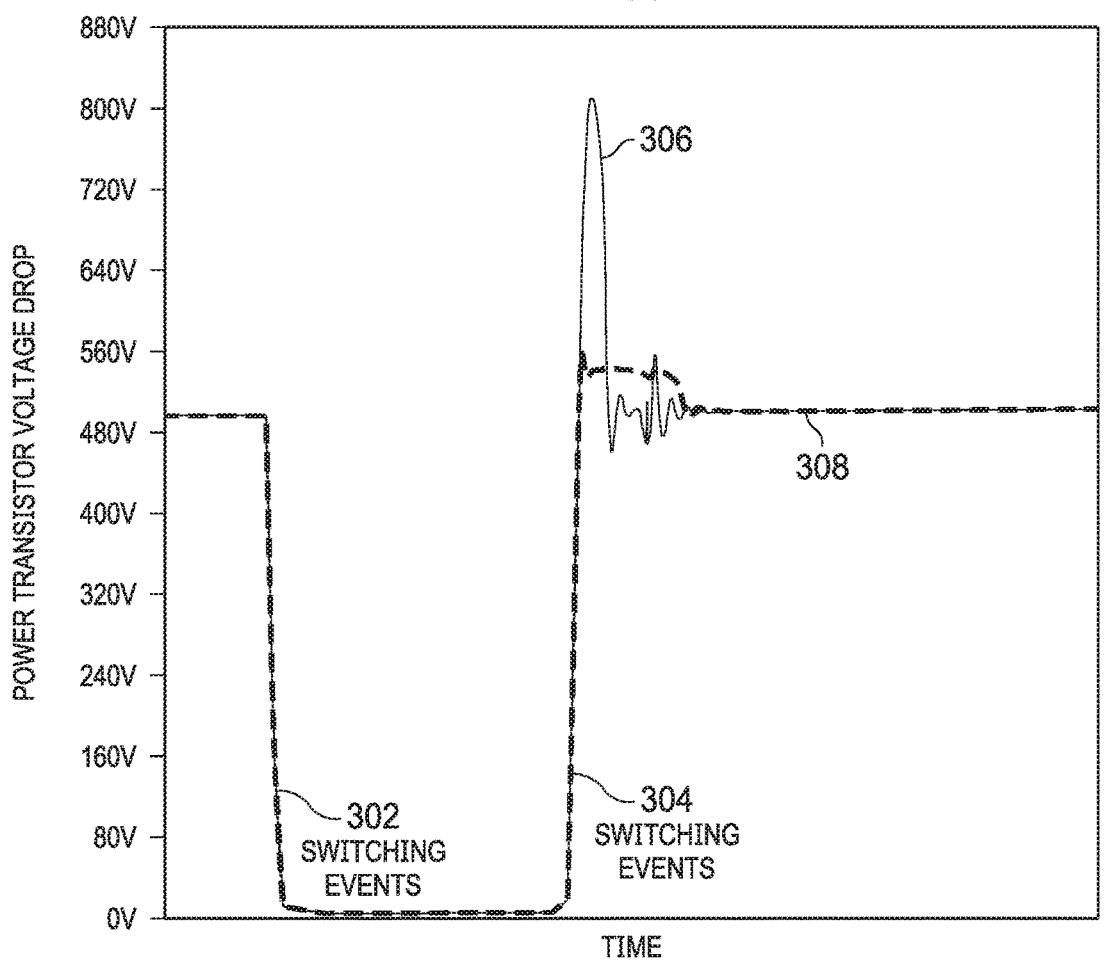
FIG. 3 shows performance of a system in accordance with various examples.

FIG. 3 shows a simulated performance of the system 100. The x-axis represents time, and the y-axis represents the voltage at the first terminal 108. The voltage at the first terminal 108 is the voltage drop across the power transistor 106. A curve 306 illustrates the voltage drop across the power transistor 106 for a conventional circuit in which the transistor 116 (and associated circuitry) is not present, and a curve 308 illustrates the voltage drop across the power transistor 106 for the system 100. The curves 306 and 308 coincide over a time duration representing switching events 302 and 304, where the power transistor 106 is switched on at the event 302 and is switched off at the event 304. In the simulation represented by FIG. 3, the load 102 is shorted at the time event 304. As the curve 306 indicates, the voltage drop across the power transistor 106 increases to about 800V, whereas the curve 308 indicates that the system 100 prevents the voltage drop across the power transistor 106 from exceeding much past 560V, a substantial improvement.

Figure 4:
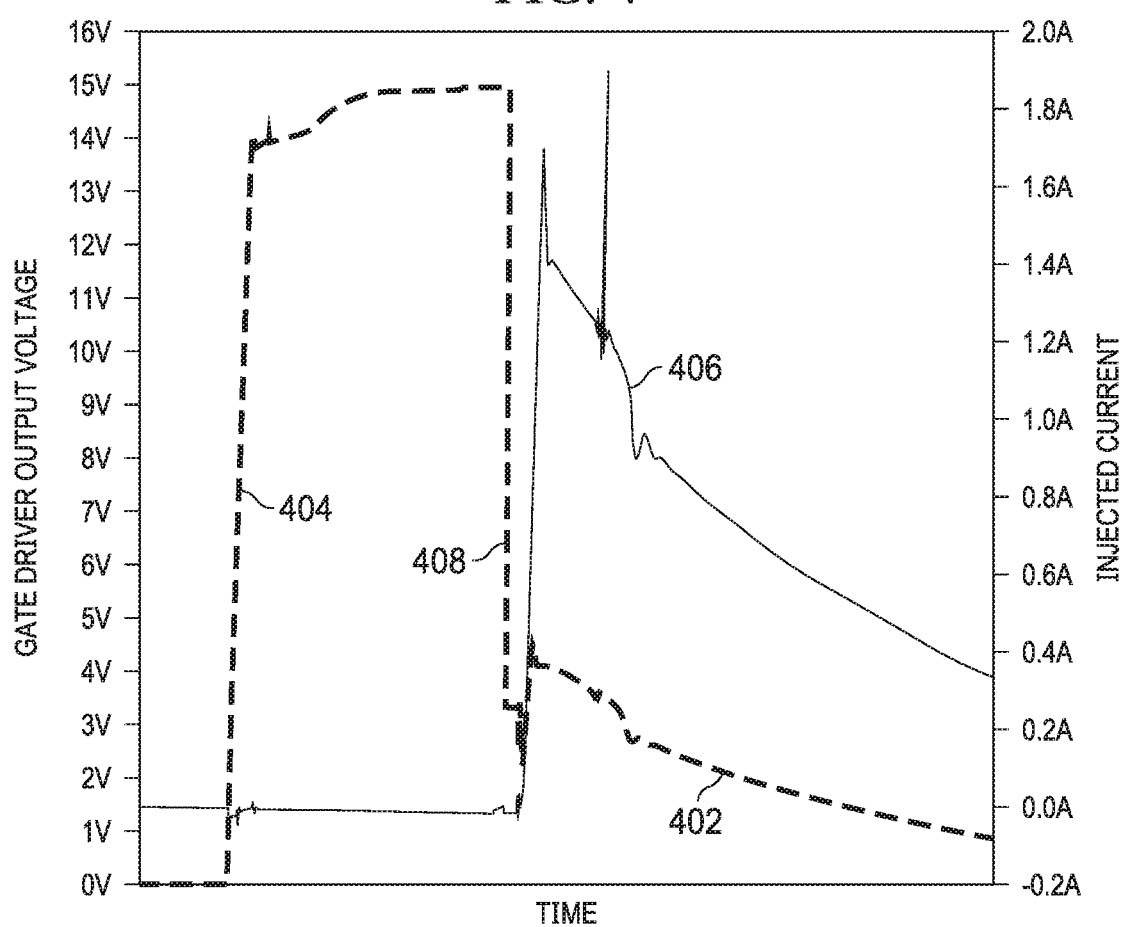
FIG. 4 shows performance of a system in accordance with various examples.

FIG. 4 shows a simulated performance of the system 100. The left y-axis represents the voltage provided by the gate driver 114 to the gate 107 of the power transistor 106, and the right y-axis represents the current injected into the gate 107 due to the transistor 116 switching on. The x-axis represents time. A curve 402 (dashed) illustrates the voltage provided by the gate driver 114, where at a time event 404 the power transistor 106 is switched off and at a time event 408 the power transistor 106 is switched on. At the time event 408, the load 102 is shorted. A curve 406 illustrates the current injected into the gate 107 by the transistor 116 switching on when the load 102 is shorted at the time event 408. As seen in FIG. 4, current is injected into the gate 107 for a period of time immediately after the event 408.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection can be through a direct connection or through an indirect connection via other devices and connections. Similarly, a device coupled between a first component or location and a second component or location can be through a direct connection or through an indirect connection via other devices and connections. An element or feature "configured to" perform a task or function can be configured (e.g., programmed or structurally designed) at a time of manufacturing by a manufacturer to perform the function and/or can be configurable (or re-configurable) by a user after manufacturing to perform the function and/or other additional or alternative functions. The configuring can be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications.

What is claimed is:

1. A system to regulate power from a first power supply to a load coupled to the first power supply, wherein a power transistor is coupled between the load and ground and the system comprises:
   a transistor having a control terminal, a first current terminal adapted to be coupled to an external second power supply and a second current terminal adapted to be coupled to a control terminal of the power transistor;
   a first resistor having a first node coupled to the control terminal of the transistor and a second node adapted to be coupled to a first terminal of a second external capacitor, the first node of the first resistor is adapted to be coupled to a first terminal of a first external capacitor;
   a second resistor having a first node coupled to the control terminal of the transistor and a second node adapted to be coupled to ground, the first node of the second resistor is adapted to be coupled to a first terminal of an first external resistor; and
   wherein a second terminal of the first external capacitor is coupled to a node between the load and a first current terminal of the power transistor and a second terminal of the second external capacitor is coupled to form a capacitive divider with the first external capacitor and the first resistor, and a second node of the first external resistor is coupled to the node between the load and the first current terminal of the power transistor to form a resistive divider with the second resistor.

2. The system of claim 1, wherein the first power supply supplies a voltage higher than a voltage supplied by the second power supply.

3. The system of claim 1, further comprising an isolation region to isolate a first voltage domain of the system from a second voltage domain of the system.

4. The system of claim 3, wherein the first voltage domain operates at a voltage greater than an operating voltage of the second voltage domain.

5. The system of claim 1, wherein a diode and a second external resistor are coupled in series between the second current terminal of the transistor and the control terminal of the power transistor.

6. The system of claim 1, wherein the power transistor is an insulated gate bipolar transistor (IGBT).

7. The system of claim 1, wherein the transistor is a metal-oxide-semiconductor field-effect-transistor (MOSFET).

8. A system to regulate power from a first power supply to a load coupled to the first power supply, wherein a power transistor is coupled between the load and ground and the system comprises:
   a transistor having a control terminal, a first current terminal and a second current terminal adapted to be coupled to a control terminal of the power transistor to inject current to the control terminal of the power transistor when the transistor is on;
   a first resistor having a first node coupled to the control terminal of the transistor and a second node adapted to be coupled to a first terminal of a second external capacitor, the first node of the first resistor is adapted to be coupled to a first terminal of a first external capacitor;

a second resistor having a first node coupled to the control terminal of the transistor and a second node adapted to be coupled to ground, the first node of the second resistor is adapted to be coupled to a first terminal of a first external resistor; and wherein the second current terminal of the transistor is adapted to be coupled to the control terminal of the power transistor through a series connected external diode and a second external resistor.

9. The system of claim 8, wherein the first current terminal of the transistor is adapted to be coupled to an external second power supply.

10. The system of claim 9, wherein the first power supply supplies a voltage higher than a voltage supplied by the second power supply.

11. The system of claim 8, further comprising an isolation region to isolate a first voltage domain of the system from a second voltage domain of the system.

12. The system of claim 11, wherein the first voltage domain operates at a voltage greater than an operating voltage of the second voltage domain.

13. The system of claim 8, wherein the power transistor is an insulated gate bipolar transistor (IGBT).

14. The system of claim 8, wherein the transistor is a metal-oxide-semiconductor field-effect-transistor (MOSFET).

15. A system to regulate power from a first power supply to a load coupled to the first power supply, the system is operable to be coupled to a power transistor, having a control terminal, a first terminal current coupled to the load and a second current terminal coupled to ground and the system comprises:

a transistor having a control terminal, a first current terminal and a second current terminal adapted to be coupled to the control terminal of the power transistor to inject current to the control terminal of the power transistor when the transistor is on;

a first resistor having a first node coupled to the control terminal of the transistor and a second node adapted to be coupled to a first terminal of a second external capacitor, the first node of the first resistor is adapted to be coupled to a first terminal of a first external capacitor;

a second resistor having a first node coupled to the control terminal of the transistor and a second node adapted to be coupled to ground, the first node of the second resistor is adapted to be coupled to a first terminal of a first external resistor; and wherein a second terminal of the first external capacitor is coupled to the first current terminal of the power transistor and a second terminal of the second external capacitor is coupled to ground to form a capacitive divider with the first external capacitor and the first resistor, and a second node of the first external resistor is coupled to the first current terminal of the power transistor to form a resistive divider with the second resistor.

* * * * *